United States Patent [19]

Uchida

[11] Patent Number: 4,710,905

[45] Date of Patent: Dec. 1, 1987

[54] SEMICONDUCTOR MEMORY DEVICE

[75] Inventor: Yukimasa Uchida, Yokohama, Japan

[73] Assignee: Kabushiki Kaisha Toshiba, Kawasaki, Japan

[21] Appl. No.: 894,494

[22] Filed: Aug. 4, 1986

Related U.S. Application Data

[63] Continuation of Ser. No. 650,105, Sep. 13, 1984.

[30] Foreign Application Priority Data

Sep. 16, 1983 [JP] Japan ................................ 58-170693

[51] Int. Cl.$^4$ ............................................. G11C 11/40
[52] U.S. Cl. ................................................. 365/229
[58] Field of Search ............... 365/226, 227, 228, 229, 365/51

[56] References Cited

U.S. PATENT DOCUMENTS 4,399,524 8/1983 Muguruma et al. ................ 365/229

FOREIGN PATENT DOCUMENTS 0055451 7/1982 European Pat. Off. ............ 365/229

OTHER PUBLICATIONS

Lineback, "Batteries in DIP Lend Static RAM Nonvalitility," Electronics Review, pp. 47-48, May 5, 1983.

Primary Examiner—James W. Moffitt
Attorney, Agent, or Firm—Finnegan, Henderson, Farabow, Garrett & Dunner

[57] ABSTRACT

A semiconductor memory device includes: a semiconductor memory which is driven in response to a power source voltage supplied between a power source pad and a ground pad; and a peripheral circuit for executing the readout of data from and the writing of the same in this semiconductor memory. The power source pad is divided into a main power source pad and a back-up power source pad. The peripheral circuit is made operative by a voltage applied between the main power source pad and ground pad. The semiconductor memory is made operative by a main power source voltage which is applied to the main power source pad and is supplied through a first diode, or by a back-up power source voltage which is applied to the back-up power source pad and is supplied through a second diode.

6 Claims, 8 Drawing Figures

SEMICONDUCTOR MEMORY DEVICE

This application is a continuation of application Ser. No. 650,105, filed Sept. 13, 1984.

BACKGROUND OF THE INVENTION

The present invention relates to a semiconductor memory device which has a back-up battery and can hold data in a nonvolatile fashion.

Conventionally, a semiconductor memory device which holds data in a nonvolatile fashion using a back-up battery is known. FIG. 1 shows such a conventional semiconductor memory device. This memory device comprises an integrated circuit chip 1 of a semiconductor memory, and a main power source 2 and back-up battery 3 which are coupled to a power source terminal VC of this integrated circuit chip 1 through diodes 4 and 5, respectively. Also, a ground terminal VS of the integrated circuit chip 1 is grounded. A primary battery or a secondary battery is used as the back-up battery 3 and supplies a data holding voltage to the semiconductor memory chip 1 in order to hold the data stored in the semiconductor memory 1 when the main power source 2 fails.

In this semiconductor memory device, if a power supply line 6 and a ground line 7 formed outside the integrated circuit chip 1 are short-circuited, the electric power of the back-up battery 3 will be rapidly lost. On the other hand, when a package in which the integrated circuit chip 1 is enclosed is pulled out from a printed circuit board, this IC chip 1 is disconnected from not only the main power source 2 but also from the back-up battery 3, so that the information stored in this IC chip 1 will be lost. Further, when the main power source 2 fails, the back-up battery 3 supplies an operating voltage to a peripheral circuit as well as to a memory cell array in the memory chip 1; therefore, the electric power consumption of this back-up battery 3 is large, thereby shortening its service life.

SUMMARY OF THE INVENTION

It is an object of the present invention to provide a semiconductor memory device which can hold data with the lowest electric power consumption during a back-up operation.

This object is accomplished by providing a semiconductor memory device comprising: a main power source pad, a back-up power source pad, a reference power source (GND) pad, a semiconductor memory including a plurality of memory cells, a unidirectional circuit element for supplying voltage applied to the main power source pad to the semiconductor memory, a unidirectional circuit element for supplying voltage applied to the back-up power source to the semiconductor memory, and a peripheral circuit, coupled between the main power source pad and the reference power source pad, for executing the readout of the data from and the writing of the same into the semiconductor memory.

In this invention, an output voltage of the back-up battery is supplied to only the semiconductor memory through the unidirectional circuit element but is not supplied to the peripheral circuit, so that an electric power consumption of this back-up battery is minimized in the back-up operating mode.

DETAILED DESCRIPTION OF THE PREFERRED EMBODIMENT

Figure 2:
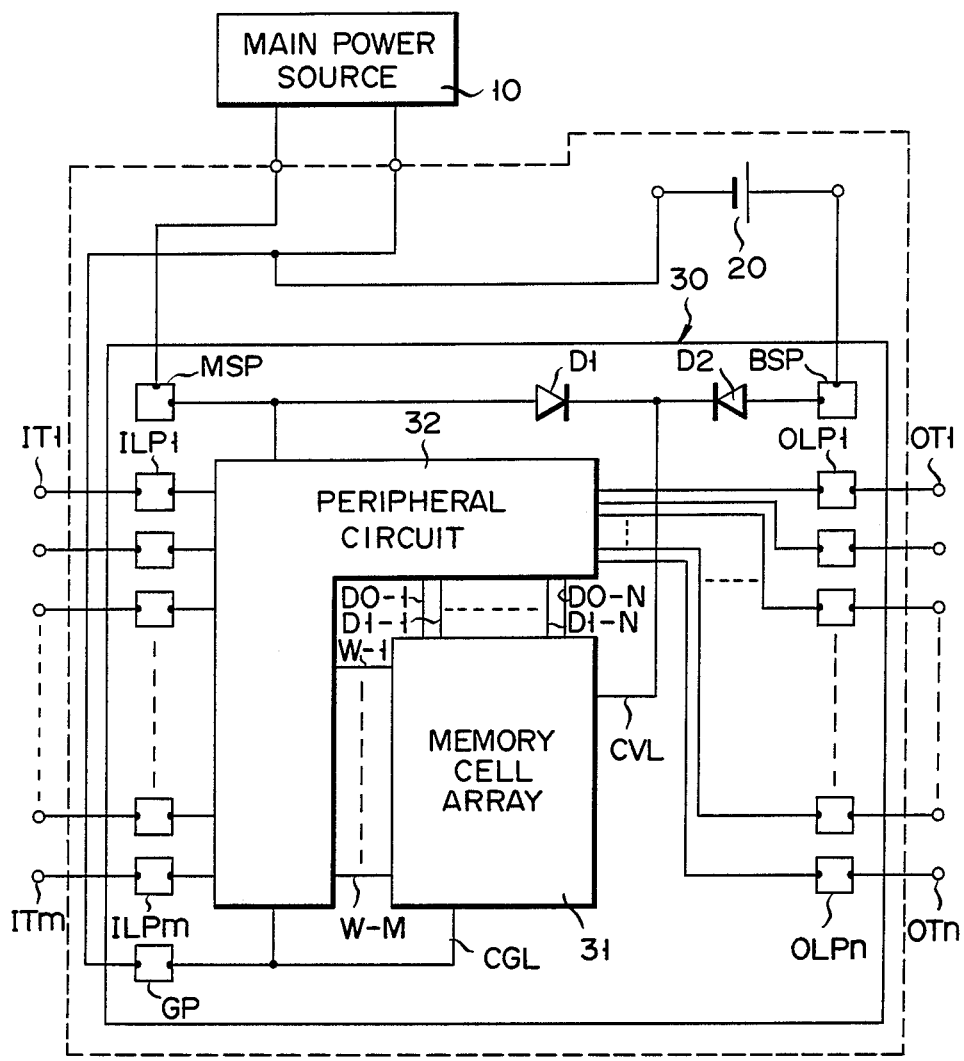
FIG. 2 shows a semiconductor memory device having a back-up battery according to one embodiment of the present invention.

FIG. 2 shows a semiconductor memory device coupled to a main power source 10 according to one embodiment of the present invention. This semiconductor memory device has a back-up battery 20 and a memory integrated circuit chip 30. This memory IC chip 30 has a memory cell array 31 which includes a plurality of memory cells arranged in a matrix form, and a peripheral circuit 32 for executing the readout of data from and the writing of the same into this memory cell array 31. Each memory cell in this memory cell 31 is constituted as shown in, e.g., FIG. 3 or 4.

Figure 1:
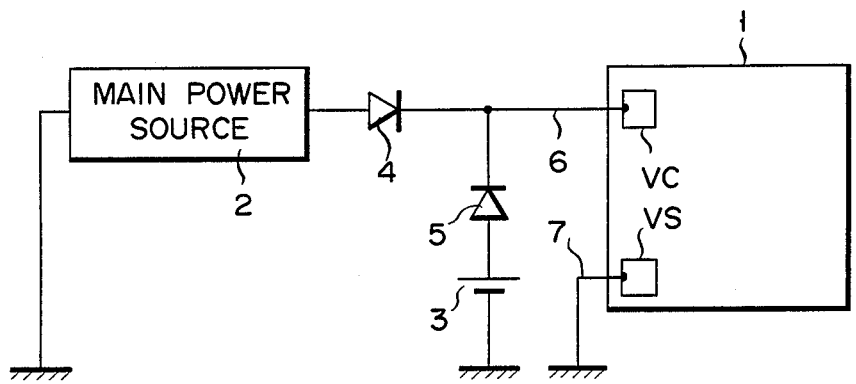
FIG. 1 shows a conventional semiconductor memory device having a back-up battery.
Figure 3:
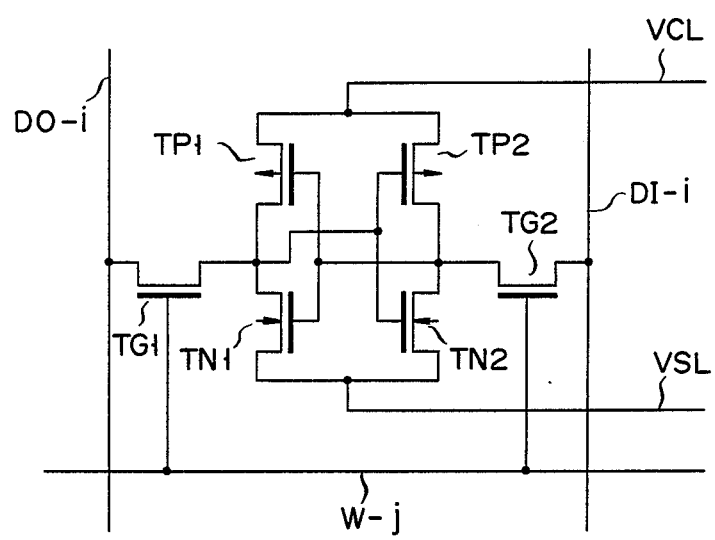
FIGS. 3 and 4 respectively show one of memory cells constituting the semiconductor memory device shown in FIG. 2.

In FIG. 3, this memory cell comprises a flip-flop which is constituted by p-channel load MOS transistors TP1 and TP2 coupled to a power supply line VCL, and n-channel driver MOS transistors TN1 and TN2 coupled to a ground line VSL. Transfer gates TG1 and TG2 coupled between the bistable terminals of this flip-flop and data lines D0-i and D1-i. The gates of these transfer gates TG1 and TG2 are coupled to a word line W-j.

Figure 4:
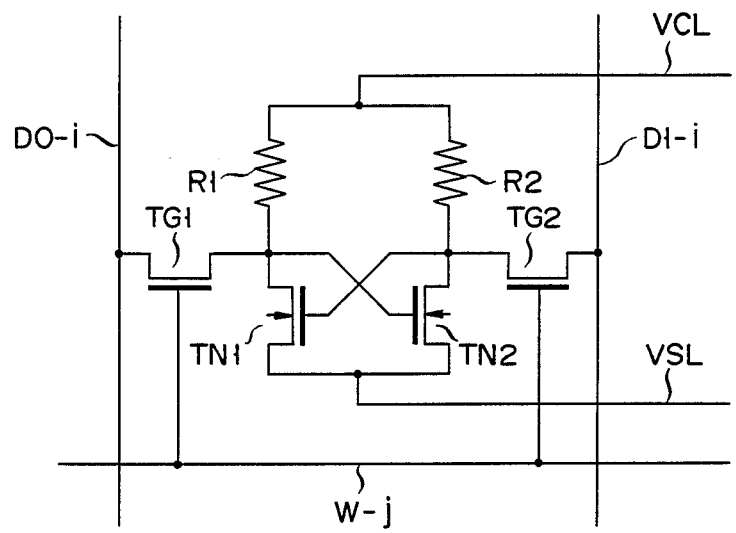

A memory cell shown in FIG. 4 is similarly constituted as that in FIG. 3 except that load resistors R1 and R2 are used in place of the p-channel load MOS transistors TP1 and TP2.

In each memory cell shown in FIGS. 3 and 4, the power supply line VCL is connected to a common power supply line CVL (shown in FIG. 2), while the reference power supply (ground) line VSL is connected to a common reference power supply (ground) line CGL (shown in FIG. 2). A main power source pad MSP (shown in FIG. 2) to which a positive terminal of the main power source 10 is connected is coupled to this common power supply line CVL through a diode D1 (shown in FIG. 2). Also, a back-up power source pad BSP (shown in FIG. 2) to which a positive terminal of the back-up power source 20 is connected is coupled to the common power supply line CVL through a diode D2 (shown in FIG. 2). On the other hand, a reference power supply (ground) pad GP (shown in FIG. 2) to which negative terminals of the main power source 10 and back-up power source 20 are connected is coupled to the common reference power supply (ground) line CGL. Further, the memory IC chip 30 shown in FIG. 2 comprises input line pads $ILP_1$ to $ILP_m$ coupled to input terminals $IT_1$ to $IT_m$ to which an address signal, a data signal and a control signal are supplied; and output line pads OLP$_1$ to OLP$_n$ coupled to output terminals OT$_1$ to OT$_n$.

Figure 5:
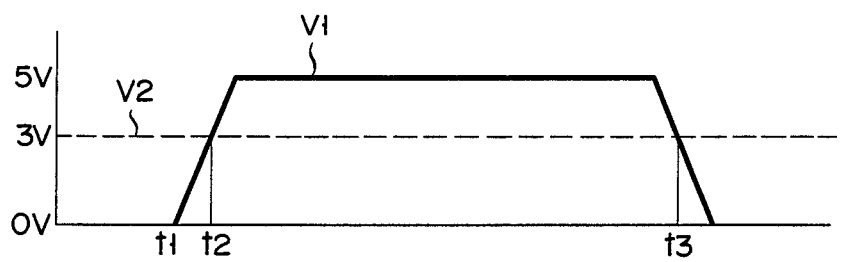
FIG. 5 shows the relation between a main power source voltage and a back-up voltage to explain the operation of the semiconductor memory device shown in FIG. 2.

As shown in FIG. 5, the semiconductor memory device shown in FIG. 2 is set at a different operating mode depending upon whether an output voltage V1 of the main power source 10 is higher or lower than an output voltage V2 of the back-up power source 20. For instance, it is assumed that the main power source 10 is turned on at time t1. In this case, the diode D1 is reversely biased before time t2 when the main power source voltage V1 becomes equal to the back-up voltge V2 of, e.g., 3 V, so that the back-up voltage V2 of 3 V is applied to the memory cell array 31 through the diode D2. This allows a data holding current to be supplied to each memory cell in this memory cell array 31, so that the data is continuously held. In this case, the main power source voltage V1 is low, and an operating voltage which is high enough to make the peripheral circuit 32 operative is not applied to the peripheral circuit 32. Thereafter, when the main power source voltage V1 becomes higher than the back-up voltage V2 and becomes, e.g., 5 V, the diode D2 is reversely biased, thereby allowing the main power source voltage V1 of 5 V to be applied to the memory cell array 31 through the diode D1. At the same time, this main power source voltage V1 of 5 V is also applied as an operating voltage to the peripheral circuit 32.

When the main power source 10 is turned off and the main power source voltage V1 becomes lower than the back-up voltage V2 at time t3, the reverse bias voltage is again applied to the diode D1, so that the back-up voltage V2 is applied to the memory cell array 31.

In the case where the main power source voltage V1 is equal to the back-up voltage V2, data holding currents are supplied from the main power source 10 and back-up power source 20 to the memory cells of the memory cell array 31.

In this way, only in the case where the main power source voltage V1 is equal to or lower than the back-up voltage V2, can electric power from the back-up battery 20 be consumed. In this case as well, electric power from the back-up power source 20 is consumed only to allow the data holding current to flow through the memory cells and its value is extremely small. Therefore, the service life of this back-up battery 20 will become very long. For example, the use of a lithium battery which is recently known as the back-up battery enables the combination of the memory IC chip 30 and back-up battery 20 surrounded by the broken line in FIG. 2 to be used practically as a nonvolatile memory for at least seven to ten years or longer.

Figure 6:
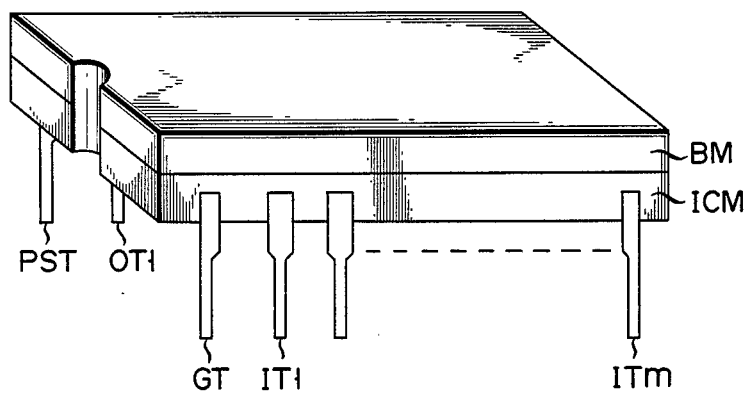
FIG. 6 is a perspective view illustrating an integrated circuit package having the semiconductor memory device shown in FIG. 2.

FIG. 6 shows an integrated circuit package including the back-up battery 20 and memory IC chip 30 shown in FIG. 2. This integrated circuit package comprises a back-up mold BM in which the back-up battery 20 is built; and an IC mold ICM in which the memory IC chip 30 is built. Lead terminals PST and GT, the input lead terminals IT$_1$ to IT$_m$, the output lead terminals OT$_1$, etc., which are respectively coupled to the positive and negative terminals of the main power source 10 are attached to this IC mold ICM. This ground lead terminal GT is coupled to the ground pad GP (FIG. 2) inside the package.

Figure 7A:
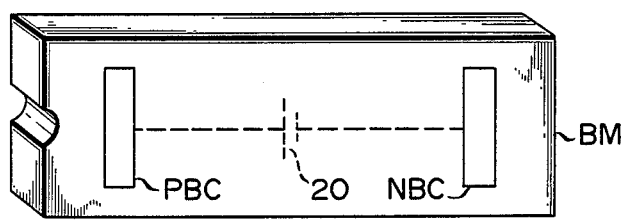
FIGS. 7A and 7B respectively show upper and lower package sections of the integrated circuit package FIG. 6.
Figure 7B:
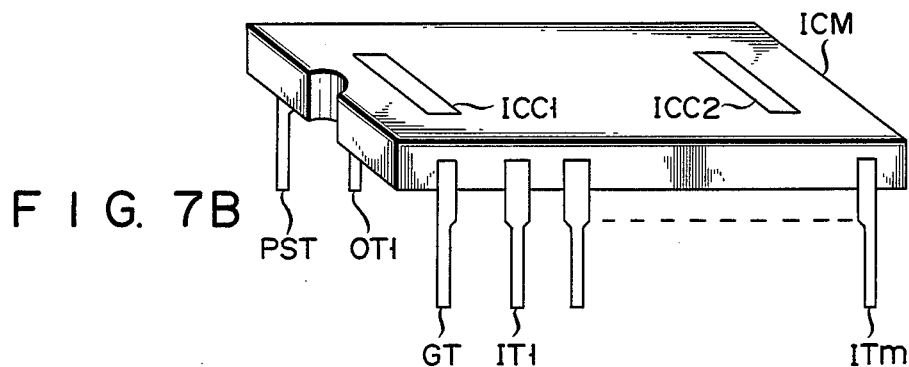

As illustrated in FIG. 7A, positive and negative back-up contacts PBC and NBC which are respectively connected to the positive and negative terminals of the back-up battery 20 are formed on one surface of the back-up mold BM. In addition, as shown in FIG. 7B, an IC contact ICC1 coupled to the back-up power source pad BSP inside the package and an IC contact ICC2 coupled to the ground lead terminal GT inside the package are formed on one surface of the IC mold ICM.

To combine the back-up mold BM and IC mold ICM, for example, the positive and negative back-up contacts PBC and NBC may be respectively connected to the IC contacts ICC1 and ICC2 with solder.

In the IC package obtained in this way, even if the power source lead terminal PST and ground lead terminal GT are short-circuited, the electric power of the back-up battery 20 will not rapidly increase. On the other hand, even if this package is pulled out from the printed circuit board at any time and due to any reason, the data stored in the memory cell array 31 will not be lost.

In this invention, since the two diodes D1 and D2 and one pad are additionally built in the memory integrated circuit chip 30, the area occupied by this chip 30 is about one percent or less. Also, since the back-up battery is built in, the installation density is remarkably raised as compared with the case where it is provided outside the package.

Although the present invention has been described above with respect to one embodiment, this invention is not limited to only this embodiment. For example, in the semiconductor memory device shown in FIG. 2, an MOS transistor in which a gate and a drain are coupled may be used in place of each of the diodes D1 and D2.

On the other hand, the back-up mold BM shown in FIGS. 7A and 7B is attached to the IC mold ICM by use of solder. However, for instance, the contacts PBC and NBC can be respectively adhered to the contacts ICC1 and ICC2 using conductive adhesive agent. In addition, by respectively forming projections and holes in the molds BM and ICM and by inserting these projections in the holes, the molds BM and ICM can be assembled.

Further, the polarities of the main power source 10, back-up battery 20, and diodes D1 and D2 may be inverted.

What is claimed is:
1. A semiconductor memory device comprising:
 a main power source pad, a back-up power source pad and a reference power supply source pad;
 first and second unidirectional circuit elements;
 a first power supply line coupled to said main power source pad and said back-up power source pad through said first and second unidirectional circuit elements, respectively, wherein electrical current flows to said first power supply line from whichever one of said main and back-up power source pads has a larger potential;
 a second power supply line coupled to said reference power supply source pad; and
 a semiconductor memory receiving an address signal, a data signal and a control signal at input terminals and including
 a cell array coupled between said first and second power supply lines and including a plurality of memory cells which are rendered operative by application of a potential difference between said first and second power supply lines, and
 peripheral circuit means, coupled to said input terminals to receive said address signal, data signal, and control signal, coupled between said main power source pad and said reference power source pad, and coupled to said semiconductor memory cell array by data lines transferring data directly with said memory cells and by word lines for selecting said cells, for enabling the reading of data from and writing data into said semiconductor memory cell array, said peripheral circuit means being isolated from said first power supply line by one of said unidirectional circuit elements such that said peripheral circuit means is not rendered operative when a potential difference between said main power source pad and said reference power source pad is lower than a potential difference between said first and second power supply lines.

2. A device according to claim 1, wherein said first and second unidirectional circuit elements are diodes.

3. A device according to claim 2, further comprising:
a first mold member which encloses said main power source pad, said back-up power source pad, said reference power supply source pad, said first and second unidirectional circuit elements, said semiconductor memory cell array, and said peripheral circuit means;
a main power source lead terminal and a reference power supply source lead terminal which are formed on said first mold member and are respectively coupled to said main power source and and said reference power supply source pad; and
a back-up power source contact and a reference power source contact which are formed on said first mold member and are respectively coupled to said back-up power source pad and said reference power source pad.

4. A device according to claim 3, further comprising:
a back-up battery;
a second mold member enclosing said backup battery; and
first and second contacts formed on said second mold member and in electrical contact with said back-up battery, said first and second contacts being respectively electrically coupled to said back-up power source contact and said reference power source contact.

5. A device according to claim 1, further comprising:
a first mold member which encloses said main power source pad, said back-up power source pad, said reference power supply source pad, said first and second unidirectional circuit elements, said semiconductor memory cell array, and said peripheral circuit means;
a main power source lead terminal and a reference power supply source lead terminal which are formed on said first mold member and are respectively coupled to said main power source pad and said reference power supply source pad; and
a back-up power source contact and a reference power supply source contact which are formed on said first mold member and are respectively coupled to said back-up power source pad and said reference power source pad.

6. A device according to claim 5, further comprising:
a second mold member which encloses a back-up battery; and
first and second contacts which are formed on said second mold member and are respectively electrically coupled to said back-up power source contact and said reference power source contact.

* * * * *